United States Patent
Liu et al.

(10) Patent No.: US 11,705,085 B2
(45) Date of Patent: Jul. 18, 2023

(54) GATE DRIVING CIRCUIT AND DISPLAY PANEL

(71) Applicants: WUHAN BOE OPTOELECTRONICS TECHNOLOGY CO., LTD., Wuhan (Hubei) (CN); BOE TECHNOLOGY GROUP CO., LTD., Beijing (CN)

(72) Inventors: Rongcheng Liu, Beijing (CN); Zhengwei AI, Beijing (CN); Wenjun Gong, Beijing (CN)

(73) Assignees: WUHAN BOE OPTOELECTRONICS TECHNOLOGY CO., LTD., Hubei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,177

(22) PCT Filed: Jun. 9, 2021

(86) PCT No.: PCT/CN2021/099152
§ 371 (c)(1),
(2) Date: May 31, 2022

(87) PCT Pub. No.: WO2022/017041
PCT Pub. Date: Jan. 27, 2022

(65) Prior Publication Data
US 2023/0005445 A1    Jan. 5, 2023

(30) Foreign Application Priority Data
Jul. 24, 2020   (CN) .......................... 202010723520.0

(51) Int. Cl.
G09G 3/12     (2006.01)
G09G 3/36     (2006.01)
G11C 19/28    (2006.01)

(52) U.S. Cl.
CPC ........... *G09G 3/3674* (2013.01); *G11C 19/28* (2013.01); *G09G 2310/0286* (2013.01); *G09G 2330/06* (2013.01)

(58) Field of Classification Search
CPC ......... G09G 3/3674; G09G 2310/0286; G11C 19/28
See application file for complete search history.

(56) References Cited

U.S. PATENT DOCUMENTS 9,396,691 B2   7/2016   Zeng
9,396,813 B2 *  7/2016  Tan .................... G11C 19/184
(Continued)

FOREIGN PATENT DOCUMENTS

CN   103293799 A   9/2013
CN   103745707 A   4/2014
(Continued)

OTHER PUBLICATIONS

International Search Report in PCT/CN2021/099152 in Chinese dated Aug. 24, 2021 with English translation.
(Continued)

*Primary Examiner* — Joe H Cheng
(74) *Attorney, Agent, or Firm* — Collard & Roe, P.C.

(57) ABSTRACT

A gate driving circuit and a display panel are provided. The gate driving circuit includes a plurality of shift register units as cascaded, and the plurality of shift register units as cascaded includes a first shift register unit including a first clock signal terminal, an (n+1)-th shift register unit including an (n+1)-th clock signal terminal, a second shift register unit including a second clock signal terminal, and an (n+2)-
(Continued)

th shift register unit including an (n+2)-th clock signal terminal. The gate driving circuit further includes a first clock signal line connected to the first clock signal terminal and the (n+1)-th clock signal terminal, and a second clock signal line connected to the second clock signal terminal and the (n+2)-th clock signal terminal.

15 Claims, 8 Drawing Sheets

(56) References Cited

U.S. PATENT DOCUMENTS

| | | | |
|---|---|---|---|
| 10,504,467 | B2 | 12/2019 | Kim et al. |
| 10,657,879 | B1* | 5/2020 | Gu .................... G11C 19/28 |
| 10,916,320 | B2* | 2/2021 | Chen .................. G09G 3/3677 |
| 11,257,455 | B2 | 2/2022 | Xiong et al. |
| 11,361,704 | B2* | 6/2022 | Zou ...................... G09G 3/32 |
| 11,361,724 | B2 | 6/2022 | He |
| 2011/0102384 | A1 | 5/2011 | Huang et al. |
| 2014/0192095 | A1 | 7/2014 | Liao |
| 2015/0002504 | A1* | 1/2015 | Jo .................... G09G 3/3677 345/99 |
| 2015/0116008 | A1 | 4/2015 | Jang et al. |
| 2016/0275894 | A1 | 9/2016 | Dai |
| 2016/0335949 | A1 | 11/2016 | Lin et al. |
| 2016/0351154 | A1 | 12/2016 | Xu et al. |
| 2018/0047329 | A1 | 2/2018 | Shang et al. |
| 2019/0013332 | A1 | 1/2019 | Lee |
| 2020/0042153 | A1* | 2/2020 | Yang ...................... G06F 3/0412 |
| 2020/0357352 | A1* | 11/2020 | Du ........................ G09G 3/3696 |

FOREIGN PATENT DOCUMENTS

| | | |
|---|---|---|
| CN | 104810004 A | 7/2015 |
| CN | 107305306 A | 10/2017 |
| CN | 108806635 A | 11/2018 |
| CN | 109243392 A | 1/2019 |
| CN | 109523963 A | 3/2019 |
| CN | 111091792 A | 5/2020 |
| JP | 2011181172 A | 9/2011 |
| KR | 10-2019-0066956 A | 6/2019 |
| WO | 2018173897 A1 | 9/2018 |

OTHER PUBLICATIONS

Written Opinion in PCT/CN2021/099152 in Chinese dated Aug. 24, 2021.

Chinese Office Action in Chinese Application No. 202010723520.0 dated May 19, 2022 with English translation.

* cited by examiner the output signals
corresponding to CLK2-CLK6 the output signals
corresponding to CLK2-CLK6

GATE DRIVING CIRCUIT AND DISPLAY PANEL

CROSS REFERENCE TO RELATED APPLICATIONS

This application is a U.S. National Phase Entry of International Application No. PCT/CN2021/099152 filed on Jun. 9, 2021, designating the United States of America and claiming priority to Chinese Patent Application No. 202010723520.0, filed on Jul. 24, 2020. The present application claims priority to and the benefit of the above-identified applications and the above-identified applications are incorporated by reference herein in their entirety.

TECHNICAL FIELD

Embodiments of the present disclosure relate to a gate driving circuit and display panel.

BACKGROUND

In the field of display technology, for example, the pixel array of a liquid crystal display generally includes rows of gate lines and columns of data lines that intersect with each other. Driving of the gate lines can be implemented by an integrated driving circuit amounted on an array substrate. In recent years, with the continuous improvement of an amorphous silicon thin film process, a gate driving circuit can also be directly fabricated on a thin film transistor array substrate to form a GOA (Gate driver On Array) to drive gate lines.

For example, the GOA formed of a plurality of cascaded shift register units can be used to provide switching voltage signals for the rows of gate lines of a pixel array, thereby controlling the rows of gate lines to be turned on sequentially. Data signals are provided by data lines to the pixel units of a corresponding row in the pixel array, thereby forming gray voltages required for displaying grayscales of an image, and displaying each frame of the image.

SUMMARY

The embodiments of the present disclosure provide a gate driving circuit and a display panel. The gate driving circuit comprises a plurality of shift register units as cascaded, and the plurality of shift register units as cascaded comprise a first shift register unit comprising a first clock signal terminal, an (n+1)-th shift register unit comprising an (n+1)-th clock signal terminal, a second shift register unit comprising a second clock signal terminal, and an (n+2)-th shift register unit comprising an (n+2)-th clock signal terminal; the gate driving circuit further comprises a first clock signal line connected to the first clock signal terminal and the (n+1)-th clock signal terminal, and a second clock signal line connected to the second clock signal terminal and the (n+2)-th clock signal terminal; the first clock signal line and the second clock signal line are arranged spaced apart, an input terminal of the first clock signal line is connected to one terminal of a first resistor, an input terminal of the second clock signal line is connected to one terminal of a second resistor, a resistance value of the second resistor is larger than a resistance value of the first resistor, and n is a positive integer greater than or equal to 2. Therefore, by connecting the second resistor to the second clock signal line, the gate driving circuit can increase the falling time Tf of the signal on the second clock signal line, thereby increasing the falling time of the output signal corresponding to the second clock signal line, and further increasing the charging time of the pixels in the row corresponding to the second clock signal line. Therefore, the gate driving circuit can make up or compensate for the problem of low pixel charging rate caused by the voltage of the second clock signal line being pulled down, thereby reducing or even eliminating the horizontal fine line phenomenon.

At least one embodiment of the present disclosure provides a gate driving circuit, the gate driving circuit comprises a plurality of shift register units as cascaded, and the plurality of shift register units as cascaded comprise a first shift register unit comprising a first clock signal terminal, an (n+1)-th shift register unit comprising an (n+1)-th clock signal terminal, a second shift register unit comprising a second clock signal terminal, and an (n+2)-th shift register unit comprising an (n+2)-th clock signal terminal; the gate driving circuit further comprises a first clock signal line connected to the first clock signal terminal and the (n+1)-th clock signal terminal, and a second clock signal line connected to the second clock signal terminal and the (n+2)-th clock signal terminal; the first clock signal line and the second clock signal line are arranged spaced apart, an input terminal of the first clock signal line is connected to one terminal of a first resistor, an input terminal of the second clock signal line is connected to one terminal of a second resistor, a resistance value of the second resistor is larger than a resistance value of the first resistor, and n is a positive integer greater than or equal to 2.

For example, in the gate driving circuit provided by an embodiment of the present disclosure, the plurality of shift register units as cascaded further comprise a k-th shift register unit comprising a k-th clock signal terminal, and a (k+n)-th shift register unit comprising a (k+n)-th clock signal terminal; and the gate driving circuit further comprises a k-th clock signal line connected to the k-th clock signal terminal and the (k+n)-th clock signal terminal, the k-th clock signal line and a (k−1)-th clock signal line are arranged spaced apart, an input terminal of the k-th clock signal line is connected to one terminal of a k-th resistor, a resistance value of the k-th resistor is larger than the resistance value of the first resistor, k is a positive integer greater than or equal to 3, and n is greater than or equal to k.

For example, in the gate driving circuit provided by an embodiment of the present disclosure, the plurality of shift register units as cascaded further comprise an (n*α+1)-th shift register unit comprising an (n*α+1)-th clock signal terminal, an (n*α+2)-th shift register unit comprising an (n*α+2)-th clock signal terminal, and an (n*α+k)-th shift register unit comprising an (n*α+k)-th clock signal terminal; and the first clock signal line is further connected to the (n*α+1)-th clock signal terminal, the second clock signal line is further connected to the (n*α+2)-th clock signal terminal, and the k-th clock signal line is further connected to the (n*α+k)-th clock signal terminal, and α is a positive integer greater than or equal to 2.

For example, in the gate driving circuit provided by an embodiment of the present disclosure, the other terminal of the first resistor is configured to be connected to a level shifting chip, the other terminal of the second resistor is configured to be connected to the level shifting chip, and the level shifting chip is configured to output clock signals to the first resistor and the second resistor, respectively.

For example, in the gate driving circuit provided by an embodiment of the present disclosure, the other terminal of the k-th resistor is configured to be connected to a level shifting chip, and the level shifting chip is configured to output a clock signal to the k-th resistor.

For example, in the gate driving circuit provided by an embodiment of the present disclosure, the resistance values of the second resistor and the k-th resistor are equal.

For example, in the gate driving circuit provided by an embodiment of the present disclosure, the resistance value of the first resistor is zero.

For example, in the gate driving circuit provided by an embodiment of the present disclosure, the resistance value of the second resistor ranges from 8 to 12 ohms.

For example, in the gate driving circuit provided by an embodiment of the present disclosure, the plurality of shift register units as cascaded are sequentially arranged in a first direction, the first clock signal line and the second clock signal line are sequentially arranged in a second direction perpendicular to the first direction, and the first clock signal line is located on a side of the second clock signal line away from the plurality of shift register units.

For example, the gate driving circuit provided by an embodiment of the present disclosure further comprises a starting pulse signal line, the starting pulse signal line is arranged in parallel with the first clock signal line and located on a side of the first clock signal line away from the plurality of shift register units, and the first rising edge of the signal on the starting pulse signal line is earlier than the first rising edge of the clock signal on the first clock signal line.

For example, the gate driving circuit provided by an embodiment of the present disclosure further comprises a global reset line, the global reset line is arranged in parallel with the first clock signal line and located at a side of the plurality of shift register units close to the second clock signal line, the first shift register unit comprises a first reset terminal, the second shift register comprises a second reset terminal, and the global reset line is connected to the first reset terminal and the second reset terminal.

For example, in the gate driving circuit provided by an embodiment of the present disclosure, the maximum value of k is 6, and the plurality of shift register units as cascaded further comprise a third shift register unit comprising a third clock signal terminal, a (3+n)-th shift register unit comprising a (3+n)-th clock signal terminal, a fourth shift register unit comprising a fourth clock signal terminal, a (4+n)-th shift register unit comprising a (4+n)-th signal terminal, a fifth shift register unit comprising a fifth clock signal terminal, a (5+n)-th shift register unit comprising a (5+n)-th clock signal terminal, a sixth shift register unit comprising a sixth clock signal terminal, and a (6+n)-th shift register unit comprising a (6+n)-th clock signal terminal; and the gate driving circuit further comprises a third clock signal line connected to the third clock signal terminal and the (3+n)-th clock signal terminal, a fourth clock signal line connected to the fourth clock signal terminal and the (4+n)-th clock signal terminal, a fifth clock signal line connected to the fifth clock signal terminal and the (5+n)-th clock signal terminal, and a sixth clock signal line connected to the sixth clock signal terminal and the (6+n)-th clock signal terminal.

For example, in the gate driving circuit provided by an embodiment of the present disclosure, the first shift register unit further comprises a first input terminal and a first output terminal, the second shift register unit further comprises a second input terminal and a second output terminal, the third shift register unit further comprises a third input terminal and a third output terminal, the fourth shift register unit further comprises a fourth input terminal and a fourth output terminal, the fifth shift register unit further comprises a fifth input terminal and a fifth output terminal, and the sixth shift register unit further comprises a sixth input terminal and a sixth output terminal; the first input terminal, the second input terminal and the third input terminal are configured to receive a starting pulse signal; and the first output terminal is connected to the fourth input terminal, the second output terminal is connected to the fifth input terminal, and the third output terminal is connected to the sixth input terminal.

For example, the gate driving circuit provided by an embodiment of the present disclosure further comprises a first electrostatic protection circuit and a second electrostatic protection circuit, one terminal of the first electrostatic protection circuit is grounded, the other terminal of the first electrostatic protection circuit is connected to the input terminal of the first clock signal line, one terminal of the second electrostatic protection circuit is grounded, and the other terminal of the second electrostatic protection circuit is connected to the input terminal of the second clock signal line.

For example, in the gate driving circuit provided by an embodiment of the present disclosure, the first electrostatic protection circuit comprises a first varistor, one terminal of the first varistor is grounded, and the other terminal of the first varistor is connected to the input terminal of the first clock signal line; and the second electrostatic protection circuit comprises a second varistor, one terminal of the second varistor is grounded, and the other terminal of the second varistor is connected to the input terminal of the second clock signal line.

At least one embodiment of the present disclosure further provides a gate driving circuit, which comprises a plurality of shift register units as cascaded; the plurality of shift register units as cascaded comprise a first shift register unit comprising a first clock signal terminal and a first input terminal, an (n+1)-th shift register unit comprising an (n+1)-th clock signal terminal, a second shift register unit comprising a second clock signal terminal, and an (n+2)-th shift register unit comprising an (n+2)-th clock signal terminal; the gate driving circuit further comprises a starting pulse signal line, a first clock signal line connected to the first clock signal terminal and the (n+1)-th clock signal terminal, a second clock signal line connected to the second clock signal terminal and the (n+2)-th clock signal terminal, and a selection circuit; the plurality of shift register units as cascaded are sequentially arranged along a first direction, the starting pulse signal line, the first clock signal line and the second clock signal line are sequentially arranged along a second direction perpendicular to the first direction, the first clock signal line is located on a side of the second clock signal line away from the plurality of shift register units, and the starting pulse signal line is located on a side of the first clock signal line away from the plurality of shift register units; and an input terminal of the starting pulse signal line is configured to input a starting clock signal, the first rising edge of the starting clock signal is earlier than the first rising edge of the clock signal on the first clock signal line, the other terminal of the starting pulse signal line is connected to the first input terminal of the first shift register unit through the selection circuit, the selection circuit is configured to convert the starting clock signal into a starting pulse signal, and n is a positive integer greater than or equal to 2.

For example, the gate driving circuit provided by an embodiment of the present disclosure further comprises a global reset line, the global reset line is arranged in parallel with the first clock signal line and located at a side of the plurality of shift register units close to the second clock signal line, the first shift register unit comprises a first reset terminal, the second shift register comprises a second reset terminal, and the global reset line is connected to the first reset terminal and the second reset terminal.

For example, in the gate driving circuit provided by an embodiment of the present disclosure, the selection circuit comprises a first control circuit comprising a first control input terminal and a first control output terminal, a second control circuit comprising a second control input terminal, a second control output terminal and a first control terminal, a third control circuit comprising a third control input terminal, a third control output terminal and a second control terminal, and a storage capacitor comprising a first electrode plate and a second electrode plate; the first control input terminal is connected to the global reset line, the first control output terminal, the first control terminal, the first electrode plate and the third control input terminal are connected to a first node, the second control input terminal is connected to the starting pulse signal line, the second control output terminal is an output terminal of the selection circuit, and the second electrode plate and the third control output terminal are respectively connected to a low-voltage power supply terminal.

For example, in the gate driving circuit provided by an embodiment of the present disclosure, the plurality of shift register units as cascaded further comprise a p-th shift register unit comprising a p-th input terminal and a p-th output terminal, the first shift register unit comprises a first input terminal and a first output terminal, the second shift register unit comprises a second input terminal and a second output terminal, the output terminal of the selection circuit is connected to the first input terminal to the p-th input terminal, the p-th output terminal is connected to the second control terminal, and p is a positive integer greater than or equal to 3.

For example, in the gate driving circuit provided by an embodiment of the present disclosure, the first control circuit comprises a first thin film transistor, the first thin film transistor comprises a first gate electrode, a first source electrode and a first drain electrode, the first gate electrode and the first source electrode serve as the first control input terminal, and the first drain electrode serves as the first control output terminal.

For example, in the gate driving circuit provided by an embodiment of the present disclosure, the second control circuit comprises a second thin film transistor, the second thin film transistor comprises a second gate electrode, a second source electrode and a second drain electrode, the second gate electrode serves as the first control terminal, the second source electrode serves as the second control input terminal, and the second drain electrode serves as the second control output terminal.

For example, in the gate driving circuit provided by an embodiment of the present disclosure, the third control circuit comprises a third thin film transistor, the third thin film transistor comprises a third gate electrode, a third source electrode and a third drain electrode, the third gate electrode serves as the second control terminal, the third source electrode serves as the third control input terminal, and the third drain electrode serves as the third control output terminal.

For example, in the gate driving circuit provided by an embodiment of the present disclosure, the plurality of shift register units as cascaded further comprise a k-th shift register unit comprising a k-th clock signal terminal and a (k+n)-th shift register unit comprising a (k+n)-th clock signal terminal; and the gate driving circuit further comprises a k-th clock signal line connected to the k-th clock signal terminal and the (k+n)-th clock signal terminal, the k-th clock signal line and a (k−1)-th clock signal line are arranged spaced apart, an input terminal of the k-th clock signal line is connected to one terminal of a k-th resistor, a resistance value of the k-th resistor is larger than the resistance value of the first resistor, k is a positive integer greater than or equal to 3, and n is greater than or equal to k.

For example, in the gate driving circuit provided by an embodiment of the present disclosure, the plurality of shift register units as cascaded further comprise an (n*α+1)-th shift register unit comprising an (n*α+1)-th clock signal terminal, an (n*α+2)-th shift register unit comprising an (n*α+2)-th clock signal terminal, and an (n*α+k)-th shift register unit comprising an (n*α+k)-th clock signal terminal; and the first clock signal line is further connected to the (n*α+1)-th clock signal terminal, the second clock signal line is further connected to the (n*α+2)-th clock signal terminal, the k-th clock signal line is further connected to the (n*α+k)-th clock signal terminal, and α is a positive integer greater than or equal to 2.

For example, in the gate driving circuit provided by an embodiment of the present disclosure, the input terminal of the first clock signal line, the input terminal of the second clock signal line and an input terminal of a starting pulse signal line are respectively connected to a level shifting chip.

For example, in the gate driving circuit provided by an embodiment of the present disclosure, the maximum value of k is 6, and the plurality of shift register units as cascaded further comprise a third shift register unit comprising a third clock signal terminal, a (3+n)-th shift register unit comprising a (3+n)-th clock signal terminal, a third clock signal line connected to the third clock signal terminal and the (3+n)-th clock signal terminal, a fourth shift register unit comprising a fourth clock signal terminal, a (4+n)-th shift register unit comprising a (4+n)-th clock signal terminal, a fourth clock signal line connected to the fourth clock signal terminal and the (4+n)-th clock signal terminal, a fifth shift register unit comprising a fifth clock signal terminal, a (5+n)-th shift register unit comprising a (5+n)-th clock signal terminal, a fifth clock signal line connected to the fifth clock signal terminal and the (5+n)-th clock signal terminal, a sixth shift register unit comprising a sixth clock signal terminal, a (6+n)-th shift register unit comprising a (6+n)-th clock signal terminal, and a sixth clock signal line connected to the sixth clock signal terminal and the (6+n)-th clock signal terminal.

For example, in the gate driving circuit provided by an embodiment of the present disclosure, the third shift register unit further comprises a third input terminal and a third output terminal, the fourth shift register unit further comprises a fourth input terminal and a fourth output terminal, the fifth shift register unit further comprises a fifth input terminal and a fifth output terminal, and the sixth shift register unit further comprises a sixth input terminal and a sixth output terminal; the first input terminal, the second input terminal and the third input terminal are connected to the output terminal of the selection circuit; and the first output terminal is connected to the fourth input terminal, the second output terminal is connected to the fifth input terminal, and the third output terminal is connected to the sixth input terminal.

For example, the gate driving circuit provided by an embodiment of the present disclosure further comprises a first electrostatic protection circuit and a second electrostatic protection circuit, one terminal of the first electrostatic protection circuit is grounded, the other terminal of the first electrostatic protection circuit is connected to an input terminal of the first clock signal line, one terminal of the second electrostatic protection circuit is grounded, and the other terminal of the second electrostatic protection circuit is connected to an input terminal of the second clock signal line.

For example, in the gate driving circuit provided by an embodiment of the present disclosure, the first electrostatic protection circuit comprises a first varistor, one terminal of the first varistor is grounded, and the other terminal of the first varistor is connected to the input terminal of the first clock signal line; and the second electrostatic protection circuit comprises a second varistor, one terminal of the second varistor is grounded, and the other terminal of the second varistor is connected to the input terminal of the second clock signal line.

At least one embodiment of the present disclosure provides a display panel, comprising a gate driving circuit according to any one of the embodiments of the present disclosure.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

In order to make objectives, technical details, and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1:
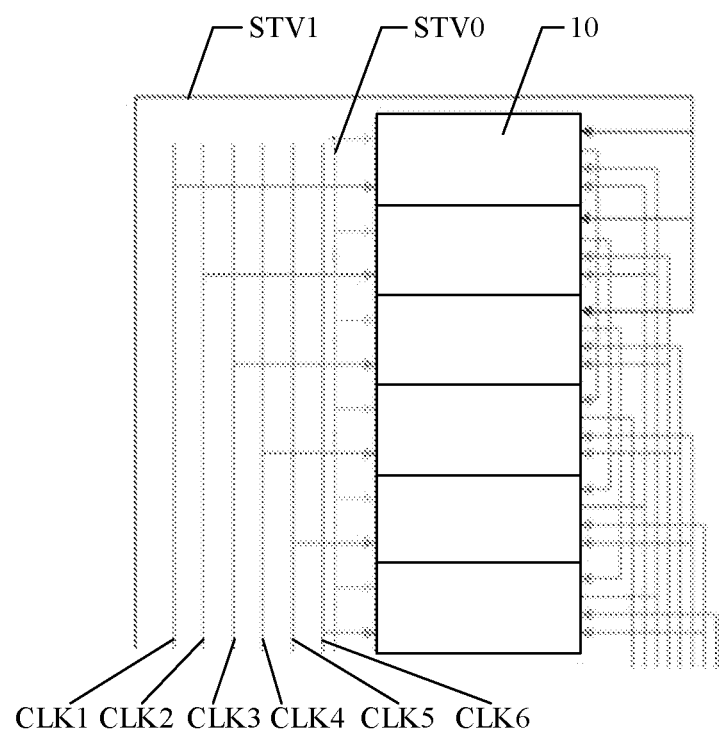
FIG. 1 is a schematic diagram of a gate driving circuit of a display panel.
Figure 2:
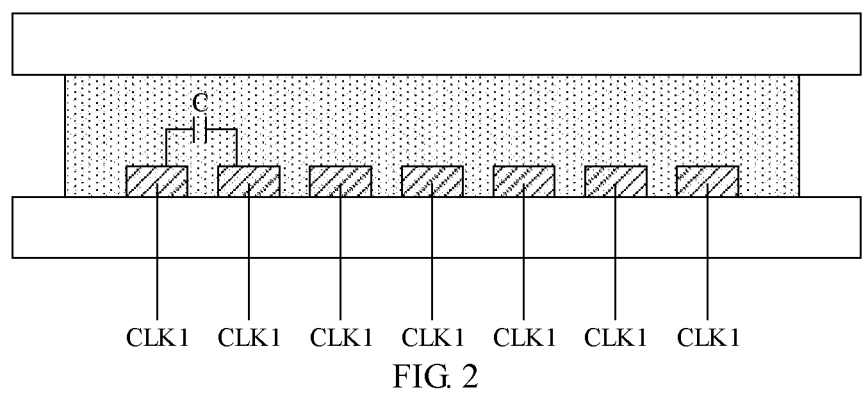
FIG. 2 is a schematic sectional view of the gate driving circuit shown in FIG. 1.

FIG. 1 is a schematic diagram of a gate driving circuit of a display panel. As illustrated by FIG. 1, the gate driving circuit includes a plurality of shift register units 10, a global reset line STV0, a starting pulse signal line STV1, a first clock signal line CLK1, a second clock signal line CLK2, a third clock signal line CLK3, a fourth clock signal line CLK4, a fifth clock signal line CLK5 and a sixth clock signal line CLK6. The starting pulse signal line STV1, the first clock signal line CLK1, the second clock signal line CLK2, the third clock signal line CLK3, the fourth clock signal line CLK4, the fifth clock signal line CLK5 and the sixth clock signal line CLK6 are sequentially arranged in the first direction. Because of the long length of these signal lines, capacitance is usually formed between adjacent signal lines. FIG. 2 is a schematic sectional view of the gate driving circuit shown in FIG. 1. As shown in FIG. 2, a capacitance C is formed between the starting pulse signal line STV1 and the first clock signal line CLK1. Similarly, a capacitance is also formed between the first clock signal line CLK1 and the second clock signal line CLK2, a capacitance is also formed between the second clock signal line CLK2 and the third clock signal line CLK3, a capacitance is also formed between the third clock signal line CLK3 and the fourth clock signal line CLK4, a capacitance is also formed between the fourth clock signal line CLK4 and the fifth clock signal line CLK5, and a capacitance is also formed between the fifth clock signal line CLK5 and the sixth clock signal line CLK6. It should be noted that a capacitance is also formed between the first clock signal line CLK1 and the third clock signal line CLK3, but the distance between the first clock signal line CLK1 and the third clock signal line CLK3 is larger, and the capacitance formed between the first clock signal line CLK1 and the third clock signal line CLK3 is smaller than that between the first clock signal line CLK1 and the second clock signal line CLK2.

Figure 3A:
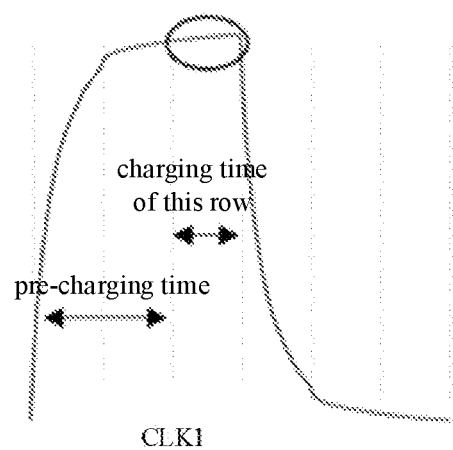
FIG. 3A-FIG. 3D are waveform diagrams of signals on signal lines in the gate driving circuit shown in FIG. 1.
Figure 3B:
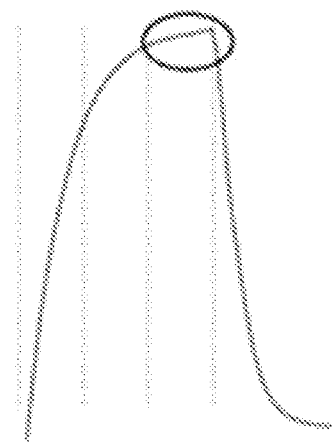
Figure 3C:
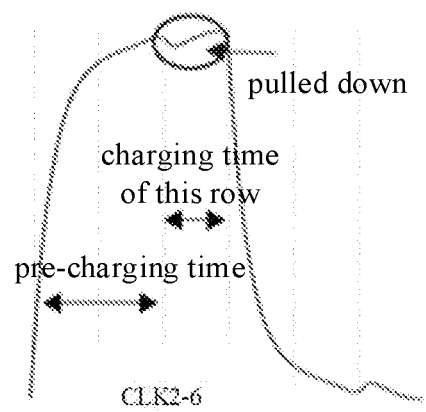
Figure 3D:
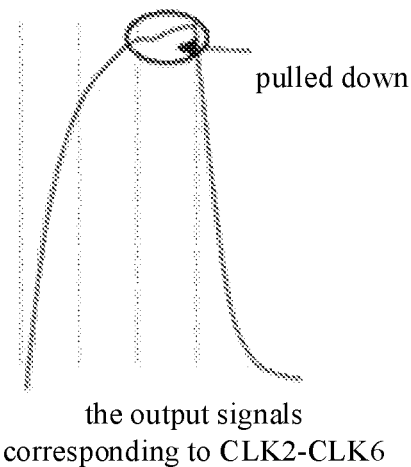

FIG. 3A-FIG. 3D are waveform diagrams of signals on signal lines in the gate driving circuit shown in FIG. 1. FIG. 3A is a waveform diagram of a signal on the first clock signal line. FIG. 3B is a waveform diagram of an output signal corresponding to the first clock signal line. FIG. 3C is a waveform diagram of signals on the second clock signal line to the sixth clock signal line. FIG. 3D is a waveform diagram of output signals corresponding to the second clock signal line to the sixth clock signal line. As illustrated by FIG. 3A, the falling edge of the first clock signal line CLK1 can cause the adjacent second clock signal line CLK2 to couple down with disturbance, which affects the output signal corresponding to the second clock signal line CLK2, and so on. The rising edge of the first clock signal line CLK1 can cause the adjacent second clock signal line CLK2 to couple up with disturbance, which affects the output signal corresponding to the second clock signal line CLK2, and so on.

The falling edge of the second clock signal line CLK2 can cause the adjacent first clock signal line CLK1 to couple down with disturbance, which affects the output signal corresponding to the first clock signal line CLK1, and so on. The rising edge of the second clock signal line CLK2 can cause the adjacent first clock signal line CLK1 to couple up with disturbance, which affects the pre-charging time of the first clock signal line CLK1, and so on. Considering the coupling between clock signal lines, as illustrated by FIG. 3C and FIG. 3D, the output signal corresponding to the first signal line CLK1 is not pulled down in the charging cycle, while the output signals corresponding to the second signal line CLK2 to the sixth signal line CLK6 are pulled down in the charging cycle.

Figure 4:
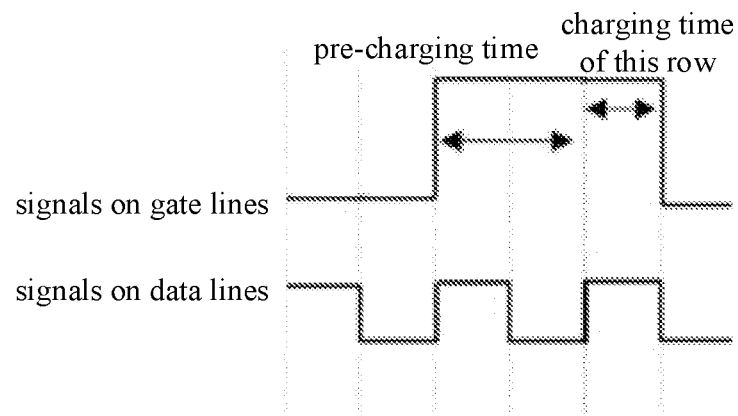
FIG. 4 is a waveform diagram of signals on data lines of the display panel shown in FIG. 1.

FIG. 4 is a waveform diagram of signals on data lines of the display panel shown in FIG. 1. As illustrated by FIG. 4, when the display panel displays a picture, the voltage on the data line fluctuates row by row, and only the voltage on the data line within the charging time of the current row is actually charged into the pixel electrode. In this case, the voltage and duration of the output signal of the gate driving circuit mentioned above can affect the charging rate of the pixels in the corresponding row. Because the output signal corresponding to the first clock signal line CLK1 is not disturbed in the charging cycle, the charging rate of the pixels in the corresponding row is normal; while the output signals corresponding to the first clock signal line CLK2 to the sixth clock signal line CLK6 are disturbed in the charging cycle, so the charging rate of the pixels of the corresponding row is low. At this time, from a macroscopic point of view, periodic horizontal fine lines may appear on the display panel, and with six rows of pixels as a cycle, the pixels in the row corresponding to the first clock signal line CLK1 are lit.

The embodiments of the present disclosure provide a gate driving circuit and a display panel. The gate driving circuit includes a plurality of shift register units as cascaded, and the plurality of shift register units as cascaded includes a first shift register unit including a first clock signal terminal, an (n+1)-th shift register unit including an (n+1)-th clock signal terminal, a second shift register unit including a second clock signal terminal, and an (n+2)-th shift register unit including an (n+2)-th clock signal terminal. The gate driving circuit further includes a first clock signal line connected to the first clock signal terminal and the (n+1)-th clock signal terminal, and a second clock signal line connected to the first clock signal terminal and the (n+2)-th clock signal terminal. The first clock signal line and the second clock signal line are arranged spaced apart, an input terminal of the first clock signal line is connected to one terminal of a first resistor, an input terminal of the second clock signal line is connected to one terminal of a second resistor, the resistance value of the second resistor is larger than the resistance value of the first resistor, and n is a positive integer greater than or equal to 2. It should be noted that the resistance value of the first resistor in the embodiment of the present disclosure may be zero, that is, the input terminal of the first clock signal line may not be connected to a resistor. Therefore, by connecting the second resistor to the second clock signal line, the gate driving circuit can increase the falling time Tf of the signal on the second clock signal line, thereby increasing the falling time of the output signal corresponding to the second clock signal line, and further increasing the charging time of the pixels in the row corresponding to the second clock signal line. Therefore, the gate driving circuit can make up or compensate for the problem of low pixel charging rate caused by the voltage of the second clock signal line being pulled down, thereby reducing or even eliminating the horizontal fine line phenomenon.

Hereinafter, the gate driving circuit and the display panel provided by the embodiments of the present disclosure are described in detail with reference to the drawings.

Figure 5:
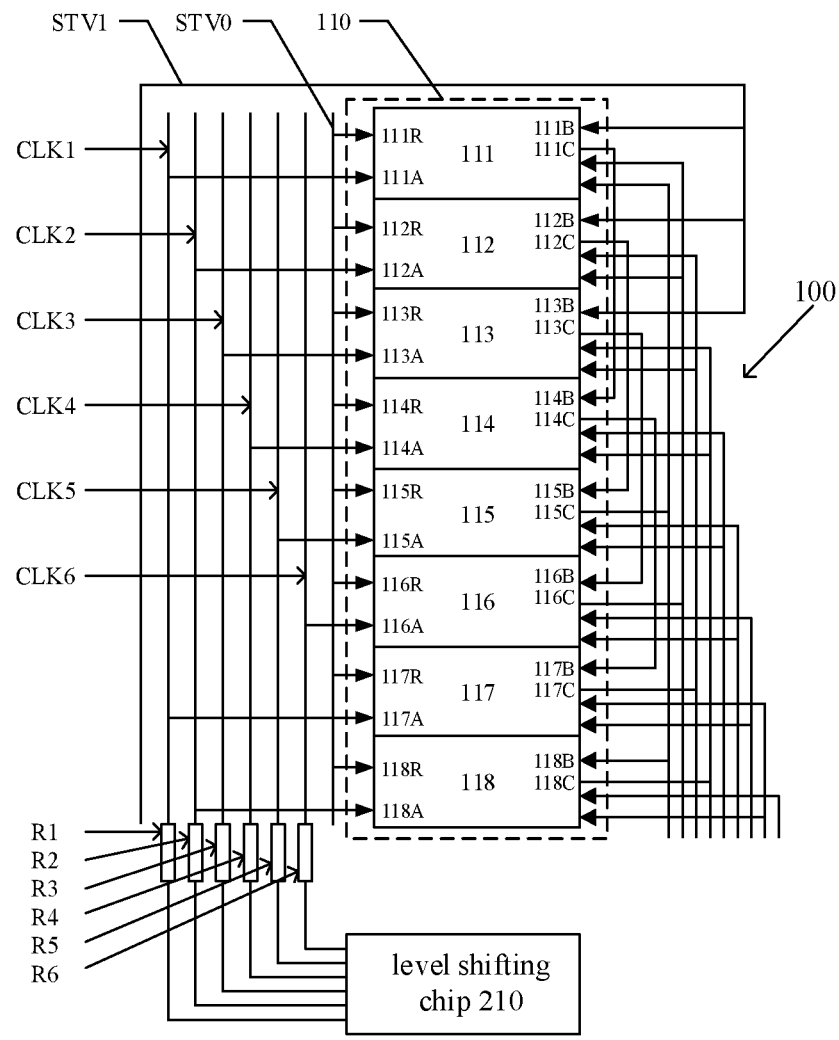
FIG. 5 is a partial schematic diagram of a gate driving circuit according to an embodiment of the present disclosure.

At least one embodiment of the present disclosure provides a gate driving circuit. FIG. 5 is a partial schematic diagram of a gate driving circuit according to an embodiment of the present disclosure. As illustrated by FIG. 5, the gate driving circuit 100 includes a plurality of shift register units 110 as cascaded, and the plurality of shift register units as cascaded 110 include a first shift register unit 111 which includes a first clock signal terminal 111A, an (n+1)-th shift register unit which includes an (n+1)-th clock signal terminal, a second shift register unit 112 which includes a second clock signal terminal 112A, and an (n+2)-th shift register unit which includes an (n+2)-th clock signal terminal. The gate driving circuit 100 further includes a first clock signal line CLK1 connected to the first clock signal terminal 111A and the (n+1)-th clock signal terminal, and a second clock signal line CLK2 connected to the second clock signal terminal 112A and the (n+2)-th clock signal terminal. The first clock signal line CLK1 and the second clock signal line CLK2 are arranged spaced apart, an input terminal of the first clock signal line CLK1 is connected to one terminal of a first resistor R1, and an input terminal of the second clock signal line CLK2 is connected to one terminal of a second resistor R2. The resistance value of the second resistor R2 is larger than the resistance value of the first resistor R1, and n is a positive integer greater than or equal to 2. It should be noted that the resistance value of the first resistor R1 in the embodiments of the present disclosure may be zero, that is, the input terminal of the first clock signal line may not be connected to a resistor.

Figure 6:
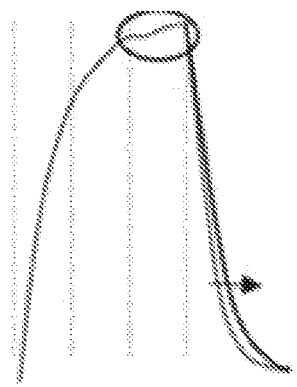
FIG. 6 is a schematic diagram of the output signal of the gate driving circuit shown in FIG. 5.

FIG. 6 is a schematic diagram of an output signal of the gate driving circuit shown in FIG. 5. As illustrated by FIG. 6, in the gate driving circuit provided by the embodiment of the present disclosure, because the resistance value of the second resistor is greater than the resistance value of the first resistor, and the resistance value of the first resistor can be zero, by connecting the second resistor to the second clock signal line, the gate driving circuit can increase the falling time Tf of the signal on the second clock signal line, thereby increasing the falling time of the output signal corresponding to the second clock signal line, and further increasing the charging time of the pixels in the row corresponding to the second clock signal line. Therefore, in the case where the falling edge of the first clock signal line CLK1 causes the adjacent second clock signal line CLK2 to be coupled down with disturbance, and the disturbance affects the voltage of the output signal corresponding to the second clock signal line CLK2 (resulting in voltage reduction), the gate driving circuit can make up or compensate for the problem of low pixel charging rate caused by the voltage on the second clock signal line being pulled down by increasing the falling time Tf of the signal on the second clock signal line, thereby reducing or even eliminating the horizontal fine line phenomenon.

In some examples, as illustrated by FIG. 5, the plurality of shift register units 110 as cascaded are sequentially arranged in a first direction, the first clock signal line CLK1 and the second clock signal line CLK2 are sequentially arranged in a second direction perpendicular to the first direction, and the first clock signal line CLK1 is located on a side of the second clock signal line CLK2 away from the plurality of shift register units as cascaded 110. Therefore, capacitance is easily formed between the first clock signal line CLK1 and the second clock signal line CLK2, and the falling edge of the first clock signal line CLK1 can cause the adjacent second clock signal line CLK2 to be coupled down with disturbance, and the disturbance affects the output signal corresponding to the second clock signal line CLK2.

For example, the width between two adjacent clock signal lines (for example, the first clock signal line and the second clock signal line) ranges from 20 to 50 microns.

In some examples, the resistance value of the first resistance R1 may be zero, that is, R1=0. The resistance value of the second resistor R2 ranges from 8 to 12 ohms, for example, 10 ohms. In this case, the display substrate can effectively compensate for the problem of low pixel charging rate caused by the voltage of the second clock signal line being pulled down, thus eliminating the horizontal fine line phenomenon. Of course, the embodiments of the present disclosure include but are not limited to thereto, and the resistance value of the second resistor can also adopt other values according to actual products.

In some examples, the plurality of shift register units 110 as cascaded further include a k-th shift register unit including a k-th clock signal terminal, and a (k+n)-th shift register unit including a (k+n)-th clock signal terminal. The gate driving circuit further includes a k-th clock signal line connected to the k-th clock signal terminal and the (k+n)-th clock signal terminal. The k-th clock signal line and a (k−1)-th clock signal line are arranged spaced apart, the input terminal of the k-th clock signal line is connected to one terminal of a k-th resistor, the resistance value of the k-th resistor is larger than the resistance value of the first resistor, k is a positive integer greater than or equal to 3, and n is greater than or equal to k. That is, the display substrate can adopt more clock signal lines to provide clock signals for the plurality of shift register units as cascaded. In the display substrate provided in this example, because the input terminal of the k-th clock signal line is connected to one terminal of the k-th resistor, and the resistance value of the k-th resistor is larger than the resistance value of the first resistor, the gate driving circuit can increase the falling time Tf of the signal on the k-th clock signal line by connecting the k-th resistor to the k-th clock signal line, thereby increasing the falling time of the output signal corresponding to the k-th clock signal line, and further increasing the charging time of the pixels in the row corresponding to the k-th clock signal line. In this way, by increasing the falling time Tf of the signal on the k-th clock signal line, the gate driving circuit can make up or compensate for the problem of low pixel charging rate caused by the voltage on the k-th clock signal line being pulled down, thereby reducing or even eliminating the horizontal fine line phenomenon.

In some examples, the plurality of shift register units further as cascaded include an $(n*\alpha+1)$-th shift register unit including an $(n*\alpha+1)$-th clock signal terminal, an $(n*\alpha+2)$-th shift register unit including an $(n*\alpha+2)$-th clock signal terminal, and an $(n*\alpha+k)$-th shift register unit including an $(n*\alpha+k)$-th clock signal terminal. The first clock signal line is further connected to the $(n*\alpha+1)$-th clock signal terminal, the second clock signal line is further connected to the $(n*\alpha+2)$-th clock signal terminal, the k clock signal line is further connected to the $(n*\alpha+k)$-th clock signal terminal, and $\alpha$ is a positive integer greater than or equal to 2.

In some examples, as illustrated by FIG. 5, in the case where n is equal to 6, that is, the maximum value of k is 6, the display substrate includes six clock signal lines, including a first clock signal line CLK1, a second clock signal line CLK2, a third clock signal line CLK3, a fourth clock signal line CLK4, a fifth clock signal line CLK5 and a sixth clock signal line CLK6. The plurality of shift register units 110 as cascaded include a first shift register unit 111, a second shift register unit 112, a third shift register unit 113, a fourth shift register unit 114, a fifth shift register unit 115, a sixth shift register unit 116, a seventh shift register unit 117 and an eighth shift register unit 118. The third shift register unit 113 includes a third clock signal terminal 113A, the fourth shift register unit 114 includes a fourth clock signal terminal 114A, the fifth shift register unit 115 includes a fifth clock signal terminal 115A, the sixth shift register unit 116 includes a sixth clock signal terminal 116A, the seventh shift register unit 117 includes a seventh clock signal terminal 117A, and the eighth shift register unit 118 includes an eighth clock signal terminal 118A. In this case, the first clock signal line CLK1 may be connected to the first clock signal terminal 111A and the seventh clock signal terminal 117A, the second clock signal line CLK2 may be connected to the second clock signal terminal 112A and the eighth clock signal terminal 118A, and so on. Therefore, every six shift register units can form a group, and the clock signals are provided by the first clock signal line CLK1, the second clock signal line CLK2, the third clock signal line CLK3, the fourth clock signal line CLK4, the fifth clock signal line CLK5 and the sixth clock signal line CLK6, respectively. The gate driving circuit adopts six clock signal lines to provide clock signals for the plurality of shift register units 110 as cascaded.

For example, n here can be regarded as the total number of clock signal lines. For example, the gate driving circuit may include a plurality of shift register units arranged in the first direction, the plurality of shift register units include a plurality of shift register unit groups arranged in the first direction, and each shift register unit group includes n shift register units. The n clock signal lines are respectively connected to n shift register units in each shift register unit group to provide clock signals for the corresponding shift register units. For each clock signal line, the k-th clock signal line is connected to the k-th clock signal terminal, the (k+n)-th clock signal terminal and the $(n*\alpha+k)$-th clock signal terminal, and $\alpha$ is a positive integer greater than or equal to 2. In this case, the gate driving circuit adopts n clock signal lines to provide clock signals for the plurality of shift register units as cascaded.

In some examples, as illustrated by FIG. 5, the other terminal of the first resistor R1 is configured to be connected to a level shifting chip 210, and the other terminal of the second resistor R2 is configured to be connected to the level shifting chip 210. The level shifting chip 210 is configured to output clock signals to the first resistor R1 and the second resistor R2, respectively, thereby applying clock signals to the first clock signal line CLK1 and the second clock signal line CLK2.

In some examples, the other terminal of the k-th resistor is configured to be connected to the level shifting chip, and the level shifting chip is further configured to output a clock signal to the k-th resistor, thereby applying the clock signal to the k-th clock signal line.

For example, as illustrated by FIG. 5, the other terminals of the third resistor R3, the fourth resistor R4, the fifth resistor R5 and the sixth resistor R6 are all configured to be connected to the level shifting chip 210, and the level shifting chip 210 can output clock signals to the third resistor R3, the fourth resistor R4, the fifth resistor R5 and the sixth resistor R6, respectively, thereby applying clock signals to the third clock signal line CLK3, the fourth clock signal line CLK4, the fifth clock signal line CLK5 and the sixth clock signal line CLK6.

In some examples, the resistance values of the second resistor R2 and the k-th resistor (for example, the third resistor R3, the fourth resistor R4, the fifth resistor R5 or the sixth resistor R6) are equal, so that the increment of the falling time Tf of the signal on the second clock signal line corresponding to the second resistor R2 is approximately equal to the increment of the falling time Tf of the signal on the k-th clock signal line corresponding to the k-th resistor, thus ensuring that the charging time of the pixels in the row corresponding to the second clock signal line is approximately equal to the charging time of the pixels in the row corresponding to the k-th clock signal line. Therefore, the gate driving circuit can make the brightness of each row of pixels in the display panel adopting the gate driving circuit more uniform.

In some examples, as illustrated by FIG. 5, the gate driving circuit 100 further includes a starting pulse signal line STV1, which is arranged in parallel with the first clock signal line CLK1 and located on a side of the first clock signal line CLK1 away from the plurality of shift register units 110. The starting pulse signal line STV1 can provide a starting signal to the plurality of shift register units 110 as cascaded. The first rising edge of the signal on the starting pulse signal line STV1 is earlier than the first rising edge of the clock signal on the first clock signal line CLK1.

In some examples, as illustrated by FIG. 5, the gate driving circuit 100 further includes a global reset line STV0, which is arranged in parallel with the first clock signal line CLK1 and located on a side of the plurality of shift register units 110 close to the second clock signal line CLK2. The first shift register unit 111 includes a first reset terminal 111R, the second shift register 112 includes a second reset terminal 112R, and the global reset line STV0 is connected to the first reset terminal 111R and the second reset terminal 112R. It should be noted that all shift register units of the gate driving circuit include reset terminals and are all connected to the global reset line. Therefore, the global reset line can provide a global reset signal to the plurality of shift register units 110 as cascaded.

In some examples, as illustrated by FIG. 5, the maximum value of k is 6, and the plurality of shift register units 110 as cascaded further include a third shift register unit including a third clock signal terminal, a (3+n)-th shift register unit including a (3+n)-th clock signal terminal, a fourth shift register unit including a fourth clock signal terminal, a (4+n)-th shift register unit including a (4+n)-th clock signal terminal, a fifth shift register unit including a fifth clock signal terminal, a (5+n)-th shift register unit including a (5+n)-th clock signal terminal, a sixth shift register unit including a sixth clock signal terminal, and a (6+n)-th shift register unit including a (6+n)-th clock signal terminal. The gate driving circuit further includes a third clock signal line connected to the third clock signal terminal and the (3+n)-th clock signal terminal, a fourth clock signal line connected to the fourth clock signal terminal and the (4+n)-th clock signal terminal, a fifth clock signal line connected to the fifth clock signal terminal and the (5+n)-th clock signal terminal, and a sixth clock signal line connected to the sixth clock signal terminal and the (6+n)-th clock signal terminal. Therefore, every six shift register units can form a group, and the clock signals are provided by the first clock signal line CLK1, the second clock signal line CLK2, the third clock signal line CLK3, the fourth clock signal line CLK4, the fifth clock signal line CLK5 and the sixth clock signal line CLK6, respectively. The gate driving circuit adopts six clock signal lines to provide clock signals for the plurality of shift register units 110 as cascaded.

In some examples, as illustrated by FIG. 5, the first shift register unit 111 further includes a first input terminal 111B and a first output terminal 111C, the second shift register unit 112 further includes a second input terminal 112B and a second output terminal 112C, the third shift register unit 113 further includes a third input terminal 113B and a third output terminal 113C, the fourth shift register unit 114 further includes a fourth input terminal 114B and a fourth output terminal 114C, the fifth shift register unit 115 further includes a fifth input terminal 115B and a fifth output terminal 115C, and the sixth shift register unit 116 further includes a sixth input terminal 116B and a sixth output terminal 116C. The first input terminal 111B, the second input terminal 112B and the third input terminal 113B are configured to receive the starting pulse signal, the first output terminal 111C is connected to the fourth input terminal 114B, the second output terminal 112C is connected to the fifth input terminal 115B, and the third output terminal 113C is connected to the sixth input terminal 116B. That is, the first input terminal 111B, the second input terminal 112B and the third input terminal 113B are directly connected to the starting pulse signal line STV1, thereby applying the starting signal to the first shift register unit 111, the second shift register unit 112 and the third shift register unit 113 using the starting pulse signal line STV1, and the subsequent shift register units can be provided with starting signals by the output signals of the previous shift register units, thus forming a cascade mode. Of course, the embodiments of the present disclosure include but are not limited to the above-mentioned cascade mode.

Figure 7:
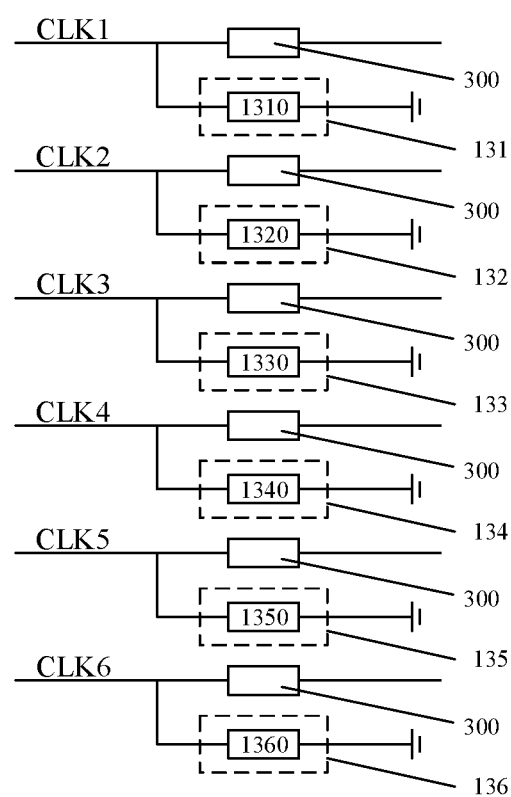
FIG. 7 is a schematic diagram of an electrostatic protection circuit in a gate driving circuit according to an embodiment of the present disclosure.

FIG. 7 is a schematic diagram of an electrostatic protection circuit in a gate driving circuit according to an embodiment of the present disclosure. As illustrated by FIG. 7, the gate driving circuit can further be provided with an electrostatic protection circuit on each clock signal line to perform electrostatic protection.

For example, as illustrated by FIG. 7, the gate driving circuit further includes a first electrostatic protection circuit 131 and a second electrostatic protection circuit 132. One terminal of the first electrostatic protection circuit 131 is grounded, the other terminal of the first electrostatic protection circuit 131 is connected to the input terminal of the first clock signal line CLK1, one terminal of the second electrostatic protection circuit 132 is grounded, and the other terminal of the second electrostatic protection circuit 132 is connected to the input terminal of the second clock signal line CLK2. It should be noted that the resistor 300 in FIG. 7 is the line resistance of each clock signal line.

For example, as illustrated by FIG. 7, the first electrostatic protection circuit 131 includes a first varistor 1310, one terminal of the first varistor 1310 is grounded, and the other terminal of the first varistor 1310 is connected to the input terminal of the first clock signal line CLK1. The second electrostatic protection circuit 132 includes a second varistor 1320, one terminal of the second varistor 1320 is grounded, and the other terminal of the second varistor 1320 is connected to the input terminal of the second clock signal line CLK2. The first varistor 1310 and the second varistor 1320 mentioned above present a large impedance (for example, above 40 KΩ) in the normal state. In the case where the first clock signal line CLK1 and the second clock signal line CLK2 mentioned above are accidentally introduced into static electricity, the first varistor and the second varistor mentioned above can be quickly reduced to below a few Ω or less, so that static electricity can be introduced to ground and prevented from entering the above-mentioned shift register unit. It should be noted that the resistor 300 in FIG. 7 is the line resistance of each clock signal line.

For example, as illustrated by FIG. 7, similarly, the gate driving circuit may further include a third electrostatic protection circuit 133, a fourth electrostatic protection circuit 134, a fifth electrostatic protection circuit 135 and a sixth electrostatic protection circuit 136.

It should be noted that the gate driving circuit illustrated by FIG. 5 adopts six clock signal lines, but the embodiments of the present disclosure include but are not limited to thereto. The gate driving circuit provided by the embodiment of the present disclosure can also adopt other numbers of clock signal lines. For example, the plurality of shift register units as cascaded include two clock signal lines, namely a first clock signal line and a second clock signal line. The plurality of shift register units as cascaded include a first shift register unit including a first clock signal terminal, an (n+1)-th shift register unit including an (n+1)-th clock signal terminal, a second shift register unit including a second clock signal terminal, and an (n+2)-th shift register unit including an (n+2)-th clock signal terminal. The first clock signal line is connected to the first clock signal terminal and the (n+1)-th clock signal terminal, and the second clock signal line is connected to the second clock signal terminal and the (n+2)-th clock signal terminal.

Another embodiment of the present disclosure provides a gate driving circuit. FIG. 5 is a partial schematic diagram of a gate driving circuit according to an embodiment of the present disclosure. As illustrated by FIG. 5, the gate driving circuit 100 includes a plurality of shift register units 110 as cascaded. The plurality of shift register units 110 as cascaded include a first shift register unit 111 including a first clock signal terminal 111A, an (n+1)-th shift register unit including an (n+1)-th clock signal terminal, a second shift register unit 112 including a second clock signal terminal 112A, and an (n+2)-th shift register unit including an (n+2)-th clock signal terminal. The gate driving circuit 100 further includes a first clock signal line CLK1 connected to the first clock signal terminal 111A and the (n+1)-th clock signal terminal, and a second clock signal line CLK2 connected to the second clock signal terminal 112A and the (n+2)-th clock signal terminal. The first clock signal line CLK1 and the second clock signal line CLK2 are arranged spaced apart. The input terminals of the first clock signal line CLK1 and the second clock signal line CLK2 are connected to resistors, so that the falling edge of the clock signal on the second clock signal line CLK2 is gentler than the falling edge of the clock signal on the first clock signal line CLK1, that is, the falling time Tf of the signal on the second clock signal line is longer than the falling time Tf of the signal on the first clock signal line.

FIG. 6 is a schematic diagram of the output signal of the gate driving circuit shown in FIG. 5. As illustrated by FIG. 6, by connecting the second resistor to the second clock signal line, the gate driving circuit can increase the falling time Tf of the signal on the second clock signal line, thereby increasing the falling time of the output signal corresponding to the second clock signal line, and further increasing the charging time of the pixels in the row corresponding to the second clock signal line. Therefore, in the case where the falling edge of the first clock signal line CLK1 causes the adjacent second clock signal line CLK2 to be coupled down with disturbance, and the disturbance affects the voltage of the output signal corresponding to the second clock signal line CLK2 (resulting in voltage reduction), the gate driving circuit can make up or compensate for the low pixel charging rate caused by the voltage on the second clock signal line being pulled down by increasing the falling time Tf of the signal on the second clock signal line, thereby reducing or even eliminating the horizontal fine line phenomenon.

Figure 8:
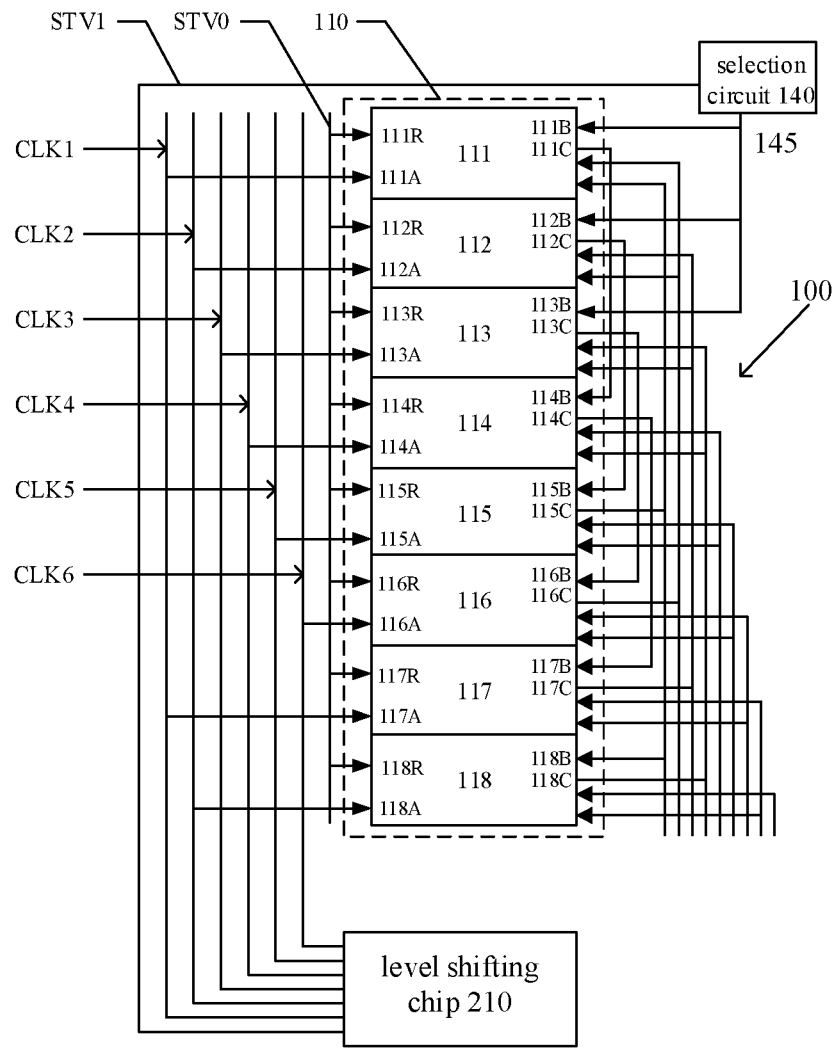
FIG. 8 is a partial schematic diagram of another gate driving circuit according to an embodiment of the present disclosure.

Another embodiment of the present disclosure further provides a gate driving circuit. FIG. 8 is a partial schematic diagram of another gate driving circuit according to an embodiment of the present disclosure. As illustrated by FIG. 8, the gate driving circuit 100 includes a plurality of shift register units 110 as cascaded, and the plurality of shift register units 110 as cascaded include a first shift register unit 111 including a first clock signal terminal 111A and a first input terminal 111B, an (n+1)-th shift register unit including an (n+1)-th clock signal terminal, a second shift register unit 112 including a second clock signal terminal 112A, and an (n+2)-th shift register unit including an (n+2)-th clock signal terminal.

As illustrated by FIG. 8, the gate driving circuit 100 further includes a starting pulse signal line STV1, a first clock signal line CLK1 connected to the first clock signal terminal 111A and the (n+1)-th clock signal terminal, a second clock signal line CLK2 connected to the second clock signal terminal 112A and the (n+2)-th clock signal terminal, and a selection circuit 140. The plurality of shift register units 110 as cascaded are sequentially arranged along a first direction, and the starting pulse signal line STV1, the first clock signal line CLK1 and the second clock signal line CLK2 are sequentially arranged along a second direction perpendicular to the first direction. The first clock signal line CLK1 is located at a side of the second clock signal line CLK2 away from the plurality of shift register units 110, and the starting pulse signal line STV1 is located on a side of the first clock signal line CLK1 away from the plurality of shift register units 110. The input terminal of the starting pulse signal line STV1 is configured to input a starting clock signal, the first rising edge of the starting clock signal is earlier than the first rising edge of the clock signal on the first clock signal line CLK1, the other terminal of the starting pulse signal line is connected to the first input terminal 111B of the first shift register unit 111 through the selection circuit 140, the selection circuit 140 is configured to convert the starting clock signal into a starting pulse signal, and n is a positive integer greater than or equal to 2.

Figure 9:
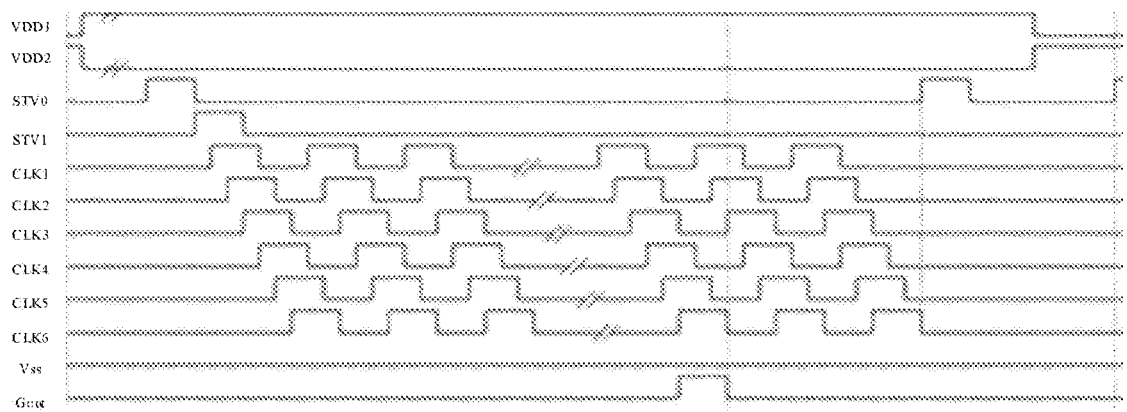
FIG. 9 is a waveform diagram of signals on each signal line in the gate driving circuit shown in FIG. 8.

In the gate driving circuit provided by the embodiment of the present disclosure, FIG. 9 is a waveform diagram of signals on signal lines in the gate driving circuit shown in FIG. 8. As illustrated by FIG. 9, the input terminal of the starting pulse signal line STV1 is configured to input the starting clock signal, and the first rising edge of the starting clock signal STV1 is earlier than the first rising edge of the clock signal on the first clock signal line CLK1. Therefore, the falling edge of the starting pulse signal line STV1 can cause the adjacent first clock signal line CLK1 to couple down with disturbance, and the disturbance affects the output signal corresponding to the first clock signal line CLK1. Therefore, the output signals corresponding to the first clock signal line CLK1 and the second clock signal line CLK2 are both affected by the disturbance, and the output signals are consistent, so that the gate driving circuit can reduce or even eliminate the horizontal fine line phenomenon. In this case, because the signal on the starting pulse signal line STV1 is a clock signal, but not a starting signal, the gate driving circuit converts the starting clock signal into the starting pulse signal by setting the selection circuit, thereby providing starting signals for the plurality of shift register units as cascaded.

In some examples, as illustrated by FIG. 8, the gate driving circuit further includes a global reset line STV0, which is arranged in parallel with the first clock signal line CLK1 and located on a side of the plurality of shift register units 110 close to the second clock signal line CLK2. The first shift register unit 111 includes a first reset terminal 111R, the second shift register 112 includes a second reset terminal 112R, and the global reset line STV0 is connected to the first reset terminal 111R and the second reset terminal 112R. It should be noted that all shift register units of the gate driving circuit include reset terminals and are all connected to the global reset line. Therefore, the global reset line can provide a global reset signal to the plurality of shift register units 110 as cascaded.

In some examples, the plurality of shift register units 110 as cascaded further include a k-th shift register unit including a k-th clock signal terminal and a (k+n)-th shift register unit including a (k+n)-th clock signal terminal. The gate driving circuit further includes a k-th clock signal line connected to the k-th clock signal terminal and the (k+n)-th clock signal terminal, the k-th clock signal line and a (k−1)-th clock signal line are arranged spaced apart, and the input terminal of the k-th clock signal line is connected to one terminal of a k-th resistor. The resistance value of the k-th resistor is larger than the resistance value of the first resistor, k is a positive integer greater than or equal to 3, and n is greater than or equal to k. That is, the display substrate can adopt more clock signal lines to provide clock signals for the plurality of shift register units as cascaded. In the display substrate provided in this example, the output signals corresponding to the first clock signal line CLK1, the second clock signal line CLK2 and the k-th clock signal line are all affected by the disturbance, and the output signals are consistent. In this way, the gate driving circuit can reduce or even eliminate the horizontal fine line phenomenon.

In some examples, as illustrated by FIG. 8, the input terminal of the first clock signal line CLK1, the input terminal of the second clock signal line CLK2, and the input terminal of the starting pulse signal line STV1 are connected to the level shifting chip 210, respectively, so that clock signals are applied to the first clock signal line CLK1, the second clock signal line CLK2, and the starting pulse signal line STV1.

In some examples, the input terminal of the k-th clock signal line is configured to be connected to the level shifting chip, and the level shifting chip is further configured to apply a clock signal to the k-th clock signal line.

In some examples, as illustrated by FIG. 8, the maximum value of k is 6, and the plurality of shift register units 110 as cascaded further include a third shift register unit including a third clock signal terminal, a (3+n)-th shift register unit including a (3+n)-th clock signal terminal, a fourth shift register unit including a fourth clock signal terminal, a (4+n)-th shift register unit including a (4+n)-th clock signal terminal, a fifth shift register unit including a fifth clock signal terminal, a (5+n)-th shift register unit including a (5+n)-th clock signal terminal, a sixth shift register unit including a sixth clock signal terminal, and a (6+n)-th shift register unit including a (6+n)-th clock signal terminal. The gate driving circuit further includes a third clock signal line connected to the third clock signal terminal and the (3+n)-th clock signal terminal, a fourth clock signal line connected to the fourth clock signal terminal and the (4+n)-th clock signal terminal, a fifth clock signal line connected to the fifth clock signal terminal and the (5+n)-th clock signal terminal, and a sixth clock signal line connected to the sixth clock signal terminal and the (6+n)-th clock signal terminal. Therefore, every six shift register units can form a group, and the clock signals are provided by the first clock signal line CLK1, the second clock signal line CLK2, the third clock signal line CLK3, the fourth clock signal line CLK4, the fifth clock signal line CLK5 and the sixth clock signal line CLK6, respectively. The gate driving circuit adopts six clock signal lines to provide clock signals for the plurality of shift register units 110 as cascaded.

In some examples, as illustrated by FIG. 8, the third shift register unit 113 further includes a third input terminal 113B and a third output terminal 113C, the fourth shift register unit 114 further includes a fourth input terminal 114B and a fourth output terminal 114C, the fifth shift register unit 115 further includes a fifth input terminal 115B and a fifth output terminal 115C, and the sixth shift register unit 116 further includes a sixth input terminal 116B and a sixth output terminal 116C. The first input terminal 111B, the second input terminal 112B and the third input terminal 113B are connected to the output terminal 145 of the selection circuit 140. The first output terminal 111C is connected to the fourth input terminal 114B, the second output terminal 112C is connected to the fifth input terminal 115B, and the third output terminal 113C is connected to the sixth input terminal 116B. Therefore, the first input terminal 111B, the second input terminal 112B and the third input terminal 113B can be connected to the selection circuit 140, thereby applying the starting signal to the first shift register unit 111, the second shift register unit 112 and the third shift register unit 113 using the selection circuit 140, and the subsequent shift register units can be provided with starting signals by the output signals of the previous shift register units, thus forming a cascade mode. Of course, the embodiments of the present disclosure include but are not limited to the above-mentioned cascade mode.

It should be noted that the gate driving circuit illustrated by FIG. 8 adopts six clock signal lines, but the embodiments of the present disclosure include but are not limited to thereto. The gate driving circuit provided by the disclosed embodiment can also adopt other numbers of clock signal lines.

For example, as illustrated by FIG. 7, the gate driving circuit can further be provided with an electrostatic protection circuit on each clock signal line to perform electrostatic protection.

For example, as illustrated by FIG. 7, the gate driving circuit further includes a first electrostatic protection circuit 131 and a second electrostatic protection circuit 132. One terminal of the first electrostatic protection circuit 131 is grounded, the other terminal of the first electrostatic protection circuit 131 is connected to the input terminal of the first clock signal line CLK1, one terminal of the second electrostatic protection circuit 132 is grounded, and the other terminal of the second electrostatic protection circuit 132 is connected to the input terminal of the second clock signal line CLK2.

For example, as illustrated by FIG. 7, the first electrostatic protection circuit includes a first varistor, one terminal of the first varistor is grounded, and the other terminal of the first varistor is connected to the input terminal of the first clock signal line. the second electrostatic protection circuit includes a second varistor, one terminal of the second varistor is grounded, and the other terminal of the second varistor is connected to the input terminal of the second clock signal line. The first varistor and the second varistor mentioned above present a large impedance (for example, above 40 KΩ) in the normal state. In the case where the first clock signal line CLK1 and the second clock signal line CLK2 mentioned above are accidentally introduced into static electricity, the first varistor and the second varistor mentioned above can be quickly reduced to below a few Ω or less, so that static electricity can be introduced to ground and prevented from entering the above-mentioned shift register unit.

Figure 10:
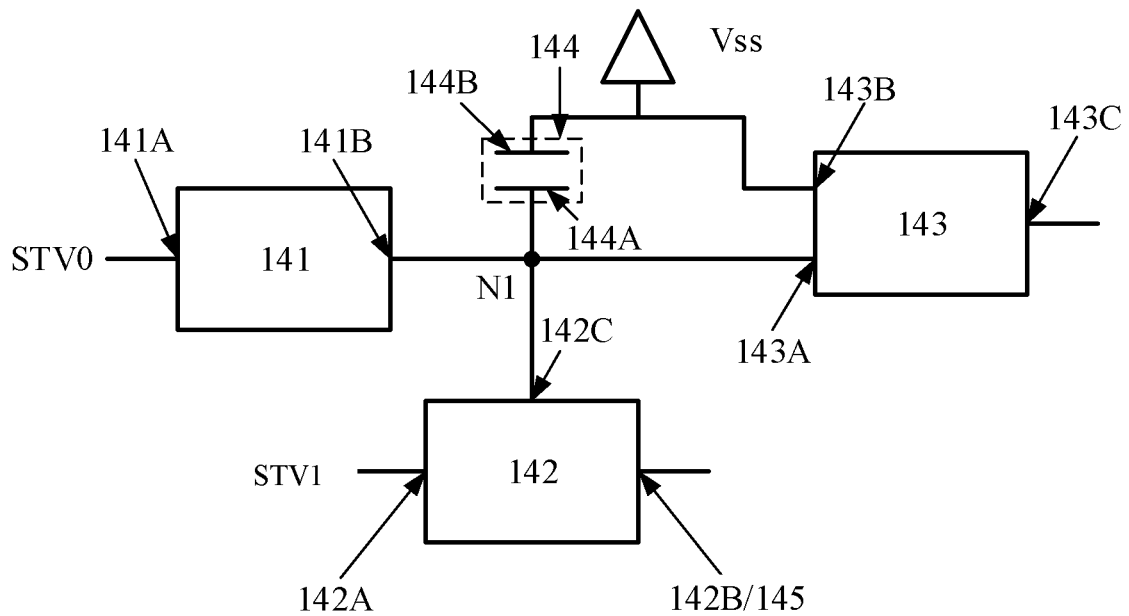
FIG. 10 is a schematic diagram of a selection circuit according to an embodiment of the present disclosure.

FIG. 10 is a schematic diagram of a selection circuit according to an embodiment of the present disclosure. As illustrated by FIG. 10, the selection circuit 140 includes a first control circuit 141 including a first control input terminal 141A and a first control output terminal 141B, a second control circuit 142 including a second control input terminal 142A, a second control output terminal 142B and a first control terminal 142C, a third control circuit 143 including a third control input terminal 143A, a third control output terminal 143B and a second control terminal 143C, and a storage capacitor 144 including a first electrode plate 144A and a second electrode plate 144B. The first control input terminal 141A is connected to the global reset line STV0, and the first control output terminal 141B, the first control terminal 142C, the first electrode plate 144A and the third control input terminal 143A are connected to the first node N1. The second control input terminal 142A is connected to the starting pulse signal line STV1, and the second control output terminal 142B is the output terminal 145 of the selection circuit 140. For example, the output terminal 145 is connected to the input terminals of the first shift register unit 110 to the third shift register unit, the second electrode plate 144B and the third control output terminal 143B are respectively connected to the low-voltage power supply terminal Vss, and the second control terminal 143C is connected to the output terminal of the third shift register unit. In the gate driving circuit provided in this example, the first control circuit can transmit the signal on the global reset line to the first node, so that the second control circuit can be turned on, and the starting pulse signal line STV1 can be output to the first shift register unit 110 to third shift register units through the second control circuit. After the third shift register unit outputs a signal, the signal on the second control terminal can turn on the third control circuit, and the signal on the global reset line is derived through the third control input terminal and the third control output terminal. Therefore, the selection circuit can realize the conversion of the starting clock signal into the starting pulse signal. Of course, the embodiments of the present disclosure include but are not limited to thereto, and the selection circuit may also adopt other structures.

In some examples, as illustrated by FIG. 8, the plurality of shift register units 110 as cascaded further include a p-th shift register unit including a p-th input terminal and a p-th output terminal, a first shift register unit 111 including a first input terminal 111B and a first output terminal 111C, and a second shift register unit 112 including a second input terminal 112B and a second output terminal 112C. As illustrated by FIG. 10, the output terminal 145 of the selection circuit 140 is connected to the first input terminal 111B to the p-th input terminal, the p-th output terminal is connected to the second control terminal, and p is a positive integer greater than or equal to 3. Therefore, the control circuit can provide starting signals to the first shift register unit to the p-th shift register unit, and after the p-th shift register unit outputs a signal, the signal on the second control terminal can turn on the third control circuit, and the signal on the global reset line is derived through the third control input terminal and the third control output terminal.

Figure 11:
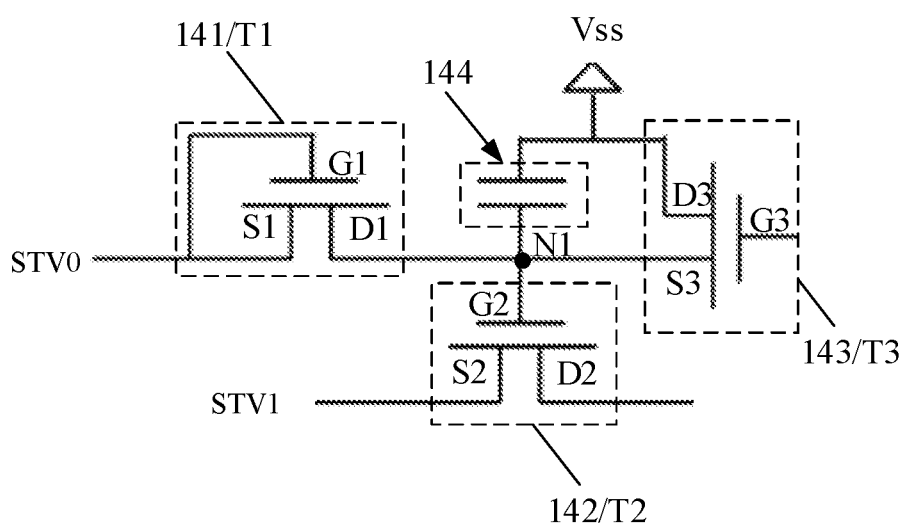
FIG. 11 is a schematic diagram of another selection circuit according to an embodiment of the present disclosure.

FIG. 11 is a schematic diagram of another selection circuit according to an embodiment of the present disclosure. As illustrated by FIG. 11, the first control circuit 141 includes a first thin film transistor T1, and the first thin film transistor T1 includes a first gate electrode G1, a first source electrode S1 and a first drain electrode D1. The first gate electrode G1 and the first source electrode S1 serve as the first control input terminal 141A, and the first drain electrode D1 serves as the first control output terminal 141B.

In some examples, as illustrated by FIG. 11, the second control circuit 142 includes a second thin film transistor T2, and the second thin film transistor T2 includes a second gate electrode G2, a second source electrode S2, and a second drain electrode D2. The second gate electrode G2 serves as the first control terminal 142C, the second source electrode S2 serves as the second control input terminal 142A, and the second drain electrode D2 serves as the second control output terminal 142B.

In some examples, as illustrated by FIG. 11, the third control circuit 143 includes a third thin film transistor T3, and the third thin film transistor T3 includes a third gate electrode G3, a third source electrode S3, and a third drain electrode D3. The third gate electrode G3 serves as the second control terminal 143C, the third source electrode S3 serves as the third control input terminal 143A, and the third drain electrode D3 serves as the third control output terminal 143B.

Figure 12:
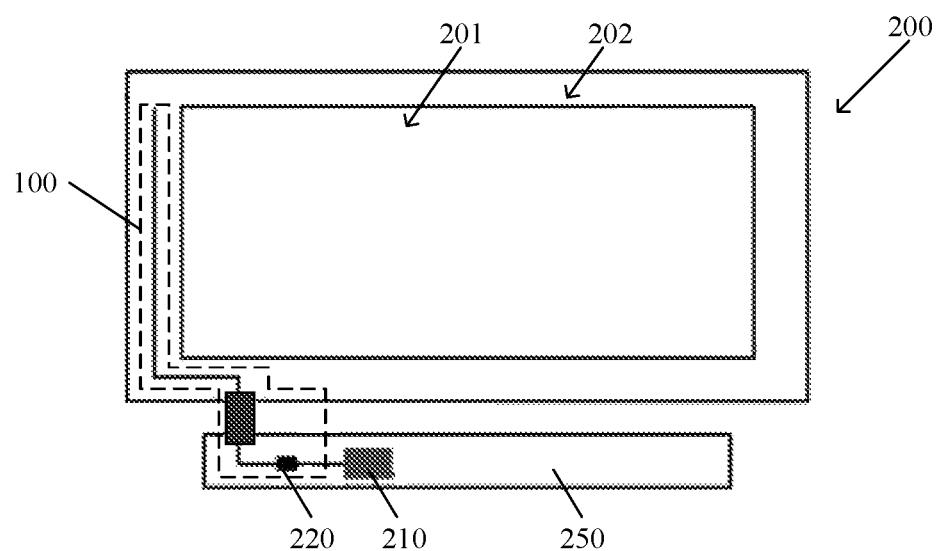
FIG. 12 is a schematic diagram of a display panel according to an embodiment of the present disclosure.

At least one embodiment of the present disclosure further provides a display panel. FIG. 12 is a schematic diagram of a display panel according to an embodiment of the present disclosure. As illustrated by FIG. 12, the display panel 200 includes the above-mentioned gate driving circuit 100. Therefore, the display panel can have beneficial effects corresponding to those of the gate driving circuit. Therefore, the display panel can reduce or even eliminate horizontal fine line phenomenon, and has high display quality.

In some examples, as illustrated by FIG. 12, the display panel 200 includes a display region 201 and a peripheral region 202 located around the display region 201. The display region 201 includes a plurality of sub-pixels (not shown), and the above-mentioned gate driving circuit 100 can be used to drive the above-mentioned sub-pixels (not shown) to emit light. The above-mentioned gate driving circuit 100 can be disposed in the peripheral region 202.

In some examples, as illustrated by FIG. 12, the display panel 200 further includes an external circuit board 250. The external circuit board 250 includes the level shifting chip 210 for applying clock signals to the clock signal lines in the gate driving circuit 100.

For example, the external circuit board 250 further includes a resistance region 220 for providing the resistors such as the first resistor R1 and the second resistor R2.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A gate driving circuit, comprising a plurality of shift register units as cascaded, wherein the plurality of shift register units as cascaded comprise:
   a first shift register unit comprising a first clock signal terminal, an (n+1)-th shift register unit comprising an (n+1)-th clock signal terminal,
a second shift register unit comprising a second clock signal terminal, and
an (n+2)-th shift register unit comprising an (n+2)-th clock signal terminal;
the gate driving circuit further comprises a first clock signal line connected to the first clock signal terminal and the (n+1)-th clock signal terminal, and a second clock signal line connected to the second clock signal terminal and the (n+2)-th clock signal terminal; and
the first clock signal line and the second clock signal line are arranged spaced apart, an input terminal of the first clock signal line is connected to one terminal of a first resistor, an input terminal of the second clock signal line is connected to one terminal of a second resistor, a resistance value of the second resistor is larger than a resistance value of the first resistor, and n is a positive integer greater than or equal to 2, n is a total number of clock signal lines.

2. The gate driving circuit according to claim 1, wherein the plurality of shift register units as cascaded further comprise:
a k-th shift register unit comprising a k-th clock signal terminal, and
a (k+n)-th shift register unit comprising a (k+n)-th clock signal terminal; and
the gate driving circuit further comprises a k-th clock signal line connected to the k-th clock signal terminal and the (k+n)-th clock signal terminal,
the k-th clock signal line and a (k−1)-th clock signal line are arranged spaced apart, an input terminal of the k-th clock signal line is connected to one terminal of a k-th resistor, a resistance value of the k-th resistor is larger than the resistance value of the first resistor,
n is greater than or equal to 3, and k is a positive integer greater than or equal to 3, and smaller or equal to n.

3. The gate driving circuit according to claim 2, wherein the plurality of shift register units as cascaded further comprise:
an (n*α+1)-th shift register unit comprising an (n*α+1)-th clock signal terminal,
an (n*α+2)-th shift register unit comprising an (n*α+2)-th clock signal terminal, and
an (n*α+k)-th shift register unit comprising an (n*α+k)-th clock signal terminal; and
the first clock signal line is further connected to the (n*α+1)-th clock signal terminal, the second clock signal line is further connected to the (n*α+2)-th clock signal terminal, and the k-th clock signal line is further connected to the (n*α+k)-th clock signal terminal, and α is a positive integer greater than or equal to 2.

4. The gate driving circuit according to claim 2, wherein the other terminal of the k-th resistor is configured to be connected to a level shifting chip, and the level shifting chip is configured to output a clock signal to the k-th resistor.

5. The gate driving circuit according to claim 1, wherein the other terminal of the first resistor is configured to be connected to a level shifting chip, the other terminal of the second resistor is configured to be connected to the level shifting chip, and the level shifting chip is configured to output clock signals to the first resistor and the second resistor, respectively.

6. The gate driving circuit according to claim 1, wherein the plurality of shift register units as cascaded are sequentially arranged in a first direction, the first clock signal line and the second clock signal line are sequentially arranged in a second direction perpendicular to the first direction, and the first clock signal line is located on a side of the second clock signal line away from the plurality of shift register units; and
the gate driving circuit further comprises a starting pulse signal line, the starting pulse signal line is arranged in parallel with the first clock signal line and located on a side of the first clock signal line away from the plurality of shift register units, and the first rising edge of the signal on the starting pulse signal line is earlier than the first rising edge of the clock signal on the first clock signal line.

7. The gate driving circuit according to claim 1, further comprising a first electrostatic protection circuit and a second electrostatic protection circuit, wherein
one terminal of the first electrostatic protection circuit is grounded, the other terminal of the first electrostatic protection circuit is connected to the input terminal of the first clock signal line, one terminal of the second electrostatic protection circuit is grounded, and the other terminal of the second electrostatic protection circuit is connected to the input terminal of the second clock signal line.

8. The gate driving circuit according to claim 7, wherein the first electrostatic protection circuit comprises a first varistor, one terminal of the first varistor is grounded, and the other terminal of the first varistor is connected to the input terminal of the first clock signal line; and
the second electrostatic protection circuit comprises a second varistor, one terminal of the second varistor is grounded, and the other terminal of the second varistor is connected to the input terminal of the second clock signal line.

9. A display panel, comprising a gate driving circuit according to claim 1.

10. A gate driving circuit, comprising a plurality of shift register units as cascaded, wherein the plurality of shift register units as cascaded comprise:
a first shift register unit comprising a first clock signal terminal and a first input terminal,
an (n+1)-th shift register unit comprising an (n+1)-th clock signal terminal,
a second shift register unit comprising a second clock signal terminal, and
an (n+2)-th shift register unit comprising an (n+2)-th clock signal terminal;
the gate driving circuit further comprises a starting pulse signal line, a first clock signal line connected to the first clock signal terminal and the (n+1)-th clock signal terminal, a second clock signal line connected to the second clock signal terminal and the (n+2)-th clock signal terminal, and a selection circuit;
the plurality of shift register units as cascaded are sequentially arranged along a first direction, the starting pulse signal line, the first clock signal line and the second clock signal line are sequentially arranged along a second direction perpendicular to the first direction, the first clock signal line is located on a side of the second clock signal line away from the plurality of shift register units, and the starting pulse signal line is located on a side of the first clock signal line away from the plurality of shift register units; and
an input terminal of the starting pulse signal line is configured to input a starting clock signal, the first rising edge of the starting clock signal is earlier than the first rising edge of the clock signal on the first clock signal line, another terminal of the starting pulse signal line is connected to the first input terminal of the first shift register unit through the selection circuit, the selection circuit is configured to convert the starting clock signal into a starting pulse signal, and n is a positive integer greater than or equal to 2, n is a total number of clock signal lines.

11. The gate driving circuit according to claim 10, further comprising a global reset line, wherein
the global reset line is arranged in parallel with the first clock signal line and located at a side of the plurality of shift register units close to the second clock signal line,
the first shift register unit comprises a first reset terminal, the second shift register comprises a second reset terminal, and the global reset line is connected to the first reset terminal and the second reset terminal.

12. The gate driving circuit according to claim 11, wherein the selection circuit comprises:
a first control circuit comprising a first control input terminal and a first control output terminal,
a second control circuit comprising a second control input terminal, a second control output terminal and a first control terminal,
a third control circuit comprising a third control input terminal, a third control output terminal and a second control terminal, and
a storage capacitor comprising a first electrode plate and a second electrode plate;
the first control input terminal is connected to the global reset line, the first control output terminal, the first control terminal, the first electrode plate and the third control input terminal are connected to a first node,
the second control input terminal is connected to the starting pulse signal line, the second control output terminal is an output terminal of the selection circuit, and the second electrode plate and the third control output terminal are respectively connected to a low-voltage power supply terminal.

13. The gate driving circuit according to claim 12, wherein the plurality of shift register units as cascaded further comprise a p-th shift register unit comprising a p-th input terminal and a p-th output terminal,
the first shift register unit further comprises a first output terminal, the second shift register unit comprises a second input terminal and a second output terminal, the output terminal of the selection circuit is connected to the first input terminal to the p-th input terminal, the p-th output terminal is connected to the second control terminal, and p is a positive integer greater than or equal to 3.

14. The gate driving circuit according to claim 13, wherein the plurality of shift register units as cascaded further comprise:
a k-th shift register unit comprising a k-th clock signal terminal; and
a (k+n)-th shift register unit comprising a (k+n)-th clock signal terminal; and
the gate driving circuit further comprises a k-th clock signal line connected to the k-th clock signal terminal and the (k+n)-th clock signal terminal,
the k-th clock signal line and a (k−1)-th clock signal line are arranged spaced apart, an input terminal of the k-th clock signal line is connected to one terminal of a k-th resistor, a resistance value of the k-th resistor is larger than the resistance value of the first resistor,
n is greater than or equal to 3, and k is a positive integer greater than or equal to 3, and smaller or equal to n.

15. The gate driving circuit according to claim 12, wherein the first control circuit comprises a first thin film transistor, the first thin film transistor comprises a first gate electrode, a first source electrode and a first drain electrode, the first gate electrode and the first source electrode serve as the first control input terminal, and the first drain electrode serves as the first control output terminal;
the second control circuit comprises a second thin film transistor, the second thin film transistor comprises a second gate electrode, a second source electrode and a second drain electrode, the second gate electrode serves as the first control terminal, the second source electrode serves as the second control input terminal, and the second drain electrode serves as the second control output terminal; and
the third control circuit comprises a third thin film transistor, the third thin film transistor comprises a third gate electrode, a third source electrode and a third drain electrode, the third gate electrode serves as the second control terminal, the third source electrode serves as the third control input terminal, and the third drain electrode serves as the third control output terminal.

* * * * *